United States Patent
Grayver et al.

(10) Patent No.: US 11,722,154 B2
(45) Date of Patent: Aug. 8, 2023

(54) HIGH-THROUGHPUT SOFTWARE-DEFINED CONVOLUTIONAL INTERLEAVERS AND DE-INTERLEAVERS

(71) Applicant: The Aerospace Corporation, El Segundo, CA (US)

(72) Inventors: Eugene Grayver, Manhattan Beach, CA (US); Mark Kubiak, Redondo Beach, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 0 days.

(21) Appl. No.: 17/193,354

(22) Filed: Mar. 5, 2021

(65) Prior Publication Data
US 2022/0283943 A1    Sep. 8, 2022

(51) Int. Cl.
*H03M 13/27* (2006.01)
*G06F 12/0813* (2016.01)
*G06F 17/18* (2006.01)

(52) U.S. Cl.
CPC .... *H03M 13/2732* (2013.01); *G06F 12/0813* (2013.01); *G06F 17/18* (2013.01); *G06F 2212/603* (2013.01); *H03M 13/2782* (2013.01)

(58) Field of Classification Search
CPC ................................................ H03M 13/2732
See application file for complete search history.

(56) References Cited

U.S. PATENT DOCUMENTS

| | | | | |
|---|---|---|---|---|
| 6,178,530 B1 * | 1/2001 | Aman | ............... | H04L 1/0052 714/702 |
| 6,546,520 B1 * | 4/2003 | Cameron | .......... | H03M 13/2789 714/701 |
| 6,785,862 B1 * | 8/2004 | Zhang | ............... | H03M 13/2782 714/788 |
| 6,985,537 B1 * | 1/2006 | Milbar | .................. | H04L 1/0071 370/344 |
| 8,850,100 B2 * | 9/2014 | Steiner | ................ | G06F 12/0607 714/6.24 |
| 10,263,739 B2 * | 4/2019 | Baek | ................... | H04L 27/2626 |
| 2006/0236192 A1 * | 10/2006 | Friddell | ............ | H03M 13/6566 714/755 |
| 2016/0043739 A1 * | 2/2016 | Taylor | .................... | G06F 11/10 714/776 |
| 2016/0173233 A1 * | 6/2016 | Loghin | ................. | H04L 1/0059 375/295 |
| 2016/0226786 A1 * | 8/2016 | Klenner | ............ | H03M 13/2796 |

* cited by examiner

*Primary Examiner* — Joseph D Torres
(74) *Attorney, Agent, or Firm* — Snell & Wilmer LLP

(57) ABSTRACT

High-throughput software-defined convolutional interleavers and de-interleavers are provided herein. In some examples, a method for generating convolutionally interleaved samples on a general purpose processor with cache is provided. Memory is represented as a three dimensional array, indexed by block number, row, and column. Input samples may be written to the cache according to an indexing scheme. Output samples may be generated every MN samples by reading out the samples from the cache in a transposed and vectorized order.

26 Claims, 11 Drawing Sheets

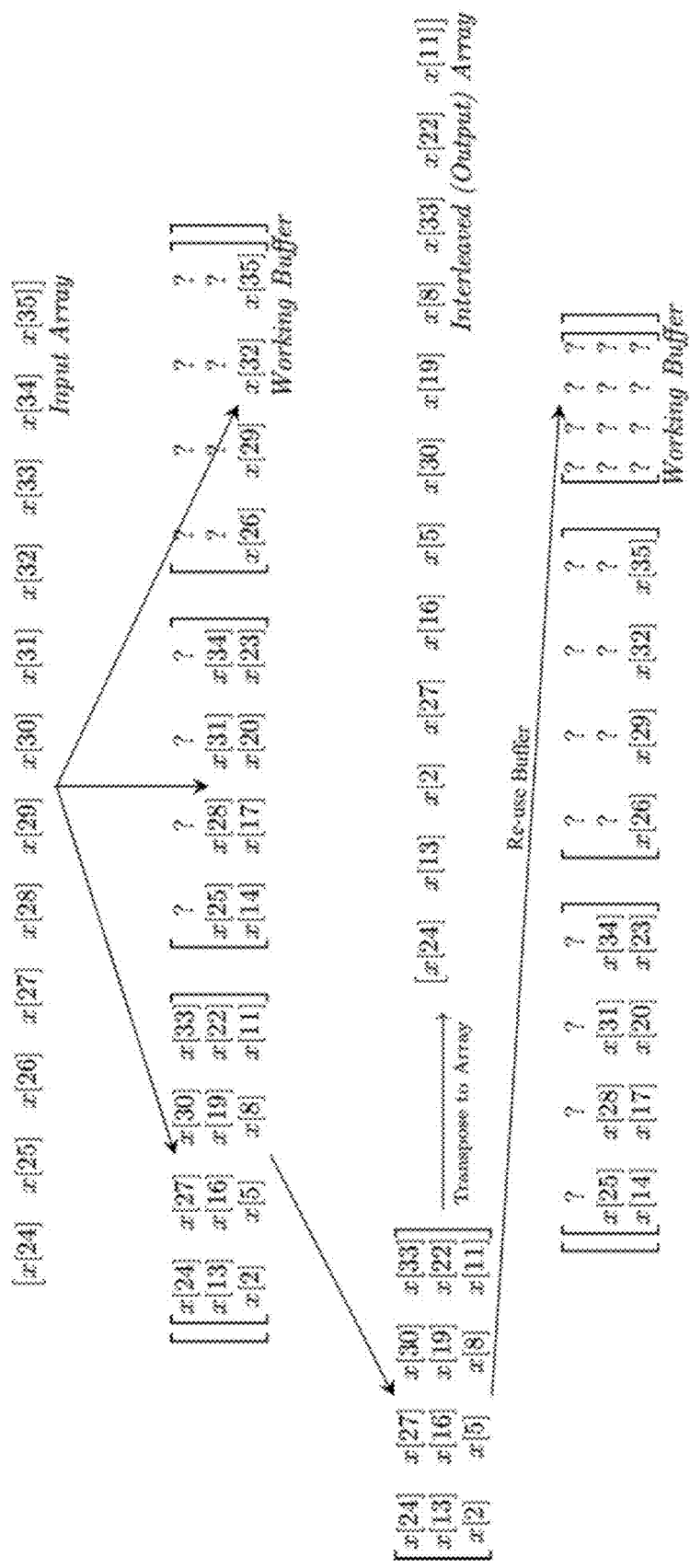

```
for (int q_idx=0; q_idx<N_over_T_over_Q; q_idx++)
{
    for (int m=0; m<M; m++)
    {
        // Move working buffer pointer to the appropriate location
        p  = work_buf;            // start of working buffer
        p += block * MN_over_T;   // start of current block
        p += m * N_over_T;        // start of current row
        p += q_idx * Q;           // start of current chunk // Move input pointer to the appropriate location
        char *i = input_buf;      // start of input buffer
        i += m;                   // start of this row's data
        i += (start_q + q_idx) * MQ; // start of valid data range // Copy Q elements from input buffer to the working buffer
        for (int q=0; q<Q; q++)
        {
            *p = *i;   // copy input value to buffer
            p += 1;    // next working buffer value is adjacent
            i += M;    // next input value is one row away
        }
        // writing diagonally, increment block #
        block += 1;
        if (block == M) block = 0;
    }
}
```

FIG. 12

HIGH-THROUGHPUT SOFTWARE-DEFINED CONVOLUTIONAL INTERLEAVERS AND DE-INTERLEAVERS

STATEMENT OF GOVERNMENT INTEREST

This invention was made with government support under Contract FA8802-19-C-0001 awarded by the Department of the Air Force. The government has certain rights in the invention.

FIELD

This application relates to implementation of the convolutional interleaving and de-interleaving algorithms.

BACKGROUND

Interleavers reorder streams of data so as to distribute any bursts of errors, such as dropout events, and thus improve the performance of forward error correction codes. For example, modern forward error correction (FEC) codes (e.g., Turbo, LDPC, convolutional) work best on uncorrelated, evenly spread-out errors. However, physical phenomena such as fading (e.g., due to temporary loss of line-of-sight) may introduce highly correlated bursts of errors. With higher carrier frequencies and the rising popularity of free-space optical communications, physical obstructions such as clouds or buildings may easily cause long dropout events. An interleaver distributes a sequence of bits across a longer duration that desirably exceeds the FEC block size, so that the FEC code may recover the data. As such, it may be desirable to distribute the sequence of bits across as long a duration as practicable. For example, an optical link at 10 Gbps may suffer a dropout of 10 ms, for which an interleaver that is at least 10 times the length of the dropout—or about 1 Gbit—would be desirable.

Convolutional interleavers can be preferable over the more standard rectangular (block) interleavers because they have lower latency (e.g., less than half that of a block interleaver), smaller memory requirements, and the ability to enable better error correction performance. Convolutional interleavers may be described as a series of M delay lines, with the number of taps in each delay line being an integer multiple of N. For each incoming sample to be interleaved, the delay line is chosen round-robin. It is common but not limited to choose convolutional interleaver parameters M and N such that $M \ll N$. This architecture is well suited to handle dropout events. For example, if a dropout causes the loss of M sequential bits, the convolutional interleaver may spread these M bits across MNM bits, with one sample error in every block of NM samples. These spread out errors are more likely to be corrected by the FEC decoder. For example, one commercial standard defines a set of convolutional interleavers with M=162 and N ranging from 1000 to 100,000.

Convolutional interleaving is most often implemented in hardware, such as field-programmable gate arrays (FPGAs) and application specific integrated circuits (ASICs). As such, convolutional interleavers have been optimized for efficient hardware implementation, and are often represented as a series of hardware shift registers. The commercially available software implementation of the convolutional interleaver in MATLAB (MathWorks, Natick Mass.) mirrors this architecture, stating that the implementation uses a set of shift registers in memory.

Another software implementation of the convolutional interleaving algorithm uses a set of M queue data structures acting as sample delay lines. Efficient queue/first-in-first-out (FIFO) data structures are often implemented in software using circular/ring buffers. A ringbuffer-backed delay line interleaver implementation closely mirrors the operation of a hardware convolutional interleaver—the sets of shift registers present in hardware implementations also act as queues to implement sample delay lines. While useful for software simulation of hardware designs, this architecture is inefficient for throughput-optimized software implementations. This is due to the dramatic hardware differences between general-purpose CPUs and FPGAs/ASICs—hardware shift registers have typically only a single clock cycle delay to read from and write to a shift register. Given the difference in memory architecture for a ringbuffer-based approach, it was suboptimal for high throughput for a real-time software defined radio (SDR) convolutional interleaver.

SUMMARY

A high-throughput software-defined implementation of the convolutional interleaving and de-interleaving algorithms are provided herein.

Some examples herein provide a method for generating convolutionally interleaved samples on a general purpose processor with cache, wherein memory is represented as a three dimensional array, indexed by block number, row, and column.

In some examples, input samples are written to the memory according to an indexing scheme.

In some examples, output samples are generated every MN samples by reading out the samples from the memory in a transposed and vectorized order.

In some examples, input samples are written in chunks of MQ samples.

In some examples, a parameter Q ($1<Q<N$) is selected to maximize throughput by balancing the amount of computation (arithmetic) and the probability of cache hit.

In some examples, the method is performed by two or more threads operating on different blocks of memory.

In some examples, an additional thread is used to provide samples to each of the two or more threads and to concatenate and output results from the two or more threads.

Some examples herein provide a method for deinterleaving convolutionally interleaved samples on a general purpose processor with cache, wherein memory is represented as a three dimensional array, indexed by block number, row, and column.

Some examples herein provide a method for processing a stream of time ordered samples of a signal. The method may be performed by at least one computer processor core in operable communication with memory. The method may include (a) writing a subset of the samples to memory blocks such that temporally adjacent samples are written to different memory blocks than one another, and at least some non-temporally adjacent samples are written to the same memory blocks as one another. The method may include (b) generating a vector by reading out the samples from at least one of the memory blocks. The method may include (c) repeating operations (a) and (b) for additional subsets of the samples and additional memory blocks to generate a sequence of vectors forming a stream of convolutionally interleaved samples of the signal.

In some examples, a portion of operation (a) and a portion of operation (b) are performed by a first processor core, and another portion of operation (a) and another portion of operation (b) are performed by a second processor core.

Some examples further include, by a third processor core: (d) receiving the vector of the samples generated in operation (b) by the first processor core and the vector of the samples generated in operation (b) from the second processor core. The third processor core also may (e) concatenate the vectors of operation (d) to generate a portion of the stream of convolutionally interleaved samples of the signal. The third processor core also may (f) output to the first processor core a portion of one of the additional subsets of the samples and output to the second processor core another portion of one of the additional subsets of the samples. The third processor core may (g) repeat operations (d) through (f), synchronously with operations (a) and (b), for the additional subsets of the samples.

In some examples, a size of the subset of the samples is selected to fit entirely within cache of the at least one computer processor core.

In some examples, operation (a) includes, in a first memory block, writing a first sample of the subset to a first location. Operation (a) further may include, in a second memory block, writing a second sample of the subset to a first location that is shifted within the second memory block relative to the first location within the first memory block. Operation (a) further may include, in a third memory block, writing a third sample of the subset to a first location that is shifted within the third memory block relative to the first location within the first memory block and relative to the first location within the second memory block. In some examples, each of the memory blocks is of dimension MN; the first location within the first memory block is $M_iN_j$; the first location within the second memory block is $M_{i+1}N_j$; and the first location within the third memory block is $M_{i+2}N_j$.

In some examples, there are M memory blocks, and operation (a) includes, in the first memory block, writing an $M^{th}$ sample of the subset to a second location. Operation (a) further may include, in the second memory block, writing an $(M+1)^{th}$ sample of the subset to a second location that is shifted within the second memory block relative to the second location within the first memory block. Operation (a) further may include, in the third memory block, writing an $(M+2)^{th}$ sample of the subset to a second location that is shifted within the third memory block relative to the second location within the first memory block and relative to the second location within the second memory block.

In some examples, operation (b) is performed responsive to respective rows of the memory blocks being respectively filled with the samples of the subset being written to them. In some examples, the memory includes M memory blocks each of dimension MN. Operation (b) may be performed responsive to row $M_i$ of a first memory block being filled, row $M_{i+1}$ of a second memory block being filled, and row $M_{i+2}$ of a third memory block being filled.

In some examples, operation (b) includes transposing and vectorizing the one of the memory blocks. In some examples, the one of the memory blocks includes locations that have been initialized but to which a sample has not yet been written.

In some examples, operation (c) includes, for at least one of the additional subsets of the samples, writing samples of that subset to the same locations of the memory blocks to which samples were written during operation (a).

In some examples, the computer processor core includes a central processing unit (CPU) or a graphical processing unit (GPU).

In some examples, each of the samples includes a multiple-bit sequence.

Some examples herein provide a computer-readable medium storing instructions for execution by at least one computer processor core in operable communication with memory. The instructions may be for causing the at least one computer processor core to perform operations that include (a) writing a subset of the samples to memory blocks such that temporally adjacent samples are written to different memory blocks than one another, and at least some non-temporally adjacent samples are written to the same memory blocks as one another. The operations further may include (b) generating a vector by reading out the samples from at least one of the memory blocks. The operations further may include (c) repeating operations (a) and (b) for additional subsets of the samples and additional memory blocks to generate a sequence of vectors forming a stream of convolutionally interleaved samples of the signal.

Some examples herein provide a method for processing a stream of convolutionally interleaved samples of a signal. The method may be performed by at least one computer processor core in operable communication with memory. The method may include (a) writing a subset of the samples to memory blocks such that at least some temporally adjacent samples are written to the same memory blocks as one another, and at least some non-temporally adjacent samples are written to different memory blocks as one another. The method may include (b) generating a vector by reading out the samples from at least one of the memory blocks. The method may include (c) repeating operations (a) and (b) for additional subsets of the samples and additional memory blocks to generate a sequence of vectors forming a stream of time ordered samples of the signal.

Some examples herein provide a computer-readable medium storing instructions for execution by at least one computer processor core in operable communication with at least one hardware cache. The instructions being for causing the at least one computer processor core to perform operations that include (a) writing a subset of the samples to memory blocks such that at least some temporally adjacent samples are written to the same memory blocks as one another, and at least some non-temporally adjacent samples are written to different memory blocks as one another. The operations also may include (b) generating a vector by reading out the samples from at least one of the memory blocks. The operations also may include (c) repeating operations (a) and (b) for additional subsets of the samples and additional memory blocks to generate a sequence of vectors forming a stream of time ordered samples of the signal.

BRIEF DESCRIPTION OF DRAWINGS

FIGS. 1A-1C schematically illustrate example operations for forming a stream of convolutionally interleaved samples of a signal using software.

FIGS. 11 and 12 illustrate additional examples flows of operations in a method for forming a stream of convolutionally interleaved samples of a signal using software.

DETAILED DESCRIPTION

Figure 1A:
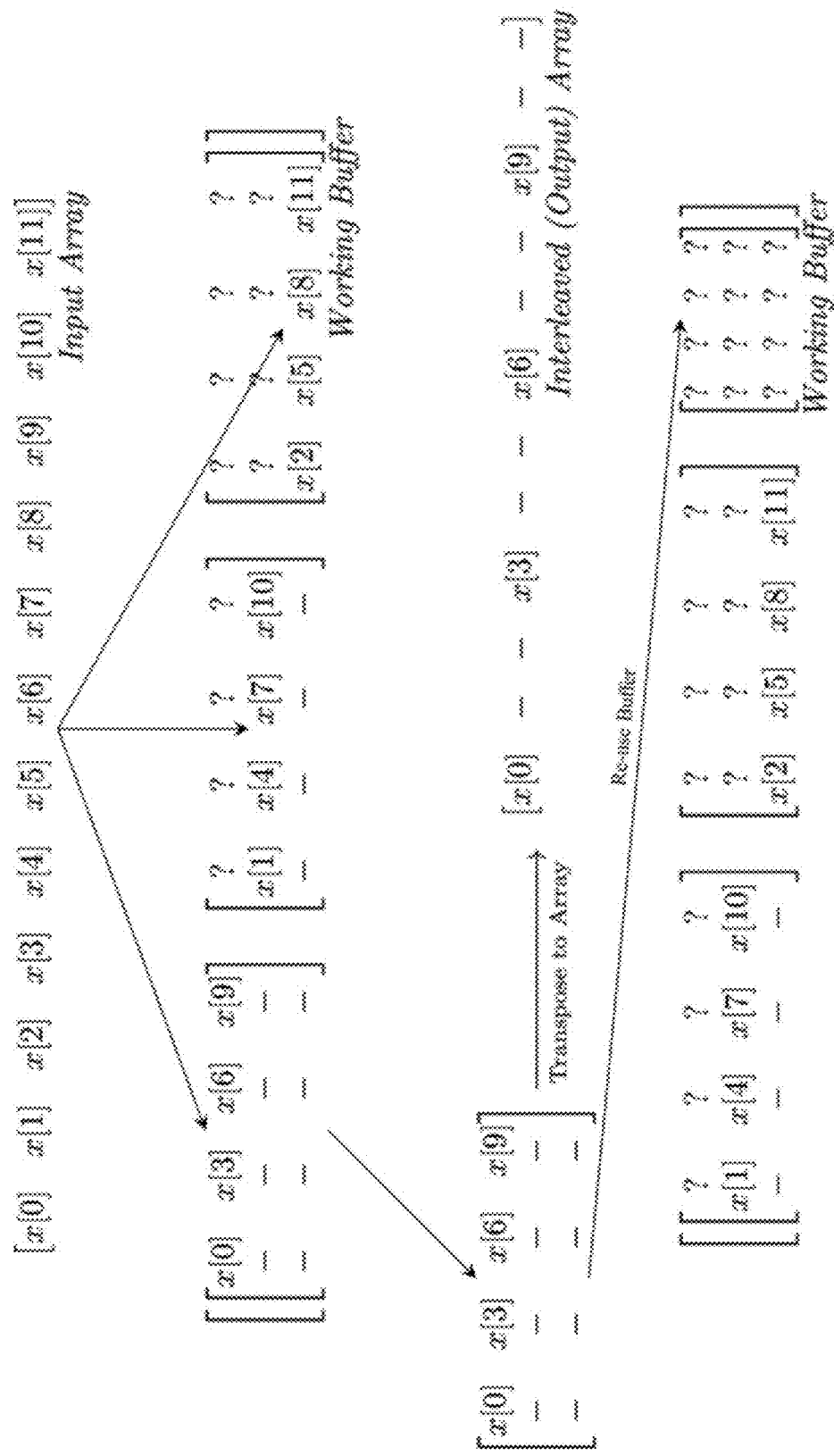

A high-throughput, software-defined, optionally multi-threaded implementation of the convolutional interleaving and de-interleaving algorithms are provided herein.

The present inventors have recognized that while the shift register design is useful for hardware implementations of convolutional interleavers, it can result in suboptimal throughout in software implementations of convolutional interleavers. For example, shift register designs do not map well to modern general-purpose processor cores (CPUs) because such designs use non-sequential memory access patterns. Non-sequential memory access is highly inefficient in modern processor cores because high-speed, low-latency cache memory assumes some level of data locality. The sparse memory pattern of a shift register design has almost no data locality, causing the processor core to frequently stall as it waits on data from high-latency external memory. In addition, these memory bottlenecks render pointless any attempts to parallelize (multithread) the software implementation, because modern processor cores share memory resources. The high-throughput software-defined convolutional interleavers and de-interleavers provided herein address such challenges by processing samples in a "cache-friendly" order leading to significantly better performance. Additionally, the presented software-defined interleavers and de-interleavers alleviate the memory access bottleneck and as such may be successfully implemented using multiple processor cores. For example, whereas the software implementation of a ringbuffer convolutional interleaver ran into memory bottlenecks at data speeds of about 0.5 GSps, the multithreaded version of the present convolutional interleaver has been benchmarked at data speeds above about 8 GSps on a mid-range server CPU, in a manner such as described further below in the Working Examples.

Matrix Representation of Convolutional Interleaver

Convolutional interleavers may be implemented by storing the appropriate number of samples in memory and then outputting them according to a predefined sequence when enough samples have been stored (NMN/2 samples for a convolutional interleaver). The 'predefined sequence' serves as a mapping from input sample indices to output sample indices, such that the interleaving process reorders input samples to a new output array. As interleaved samples are written to the output, new samples are added to memory to replace those written out. Equations 1-3 provide the system of equations for convolutional interleaving. Note that negative indices of x[n] are ignored (left uninitialized).

$$row[n] = \mod(n, M) \quad (1)$$

$$col[n] = \text{floor}\left(\frac{n}{M}\right) \quad (2)$$

$$y[n] = x[row[n] - NM \times row[n] + M \times col[n]] \quad (3)$$

The present inventors recognized that to redesign the architecture of a convolutional interleaver, it is helpful to depart from the delay-line representations of the interleaving operation. For example, the present inventors recognized that the entire interleaving operation can be reframed as a processor's set of writes to and reads from a matrix, wherein the matrix is instantiated in memory. For example, a processor core may receive, and efficiently store into an input buffer a stream of time ordered samples of a signal, which samples may be represented as having indices 0, 1, 2, 3, ... 33 .... The processor then may efficiently write the samples to selected memory locations, which respectively correspond to elements of the matrix. The processor then may efficiently read out the samples from the matrix in a different order than which the samples were written, such that the samples are convolutionally interleaved with one another. The computer processor core may, for example, include a central processing unit (CPU) or a graphical processing unit (GPU). The sequence of addresses for read and write operations is designed to take advantage of the fast cache memory associated with the processor.

In a conceptually simple example for illustrative purposes, the samples may be written into a single matrix (or two-dimensional array) of size M×∞. For each row of index m∈{0, 1, ..., M−1}, the first Nm elements of the matrix are skipped such that writes into this matrix start at index Nm for each row. An example for the case of M=3, N=4 is provided below, in which values represent the corresponding array indices for samples in the input buffer, with values of—left uninitialized.

$$\begin{bmatrix} 0 & 3 & 6 & 9 & 12 & 15 & 18 & 21 & 24 & 27 & 30 & 33 & \dots \\ \_ & \_ & \_ & \_ & 1 & 4 & 7 & 10 & 13 & 16 & 19 & 22 & \dots \\ \_ & \_ & \_ & \_ & \_ & \_ & \_ & \_ & 2 & 5 & 8 & 11 & \dots \end{bmatrix}$$

The write pattern shown in the above M×∞ matrix repeats infinitely such that input values are written on a diagonal such that the first Nm values of each row are skipped. Once all rows have been populated, the writes shift right by one column and the row index is reset to zero. The processor may read out the sample values column-wise, top-to-bottom per column (an operation corresponding to transposing and vectorising the matrix) to an output buffer. For the example presented in the above M×∞ matrix, the first few samples output by the processor would have the indices shown in the below vector:

[0,-,-,3,-,-,6,-,-,9,-,-,12,1,-,15,4,-]

However, because infinite-size matrices are impossible (and unnecessary) to implement in fixed-size memory, the present inventors recognized that these operations may be refactored into a set of fixed-sized M×N matrices as shown below, which reframes the M×∞ matrix above into an infinite set of block matrices, and in which read/write ordering are kept the same.

$$\begin{bmatrix} \begin{bmatrix} 0 & 3 & 6 & 9 \\ \_ & \_ & \_ & \_ \\ \_ & \_ & \_ & \_ \end{bmatrix} \begin{bmatrix} 12 & 15 & 18 & 21 \\ 1 & 4 & 7 & 8 \\ \_ & \_ & \_ & \_ \end{bmatrix} \begin{bmatrix} 24 & 27 & 30 & 33 \\ 13 & 16 & 19 & 22 \\ 2 & 5 & 8 & 11 \end{bmatrix} \dots \end{bmatrix}$$

While it may initially appear that infinite M×N matrices are required, the present inventors further recognized that just N such matrices may satisfactorily be used at any given point in time and suitably fit within a hardware cache, because there is no practical need to indefinitely store the entire history of the sample stream, in matrix form, within the hardware cache. For example, after writing N samples to a row of each matrix (NM total samples), the processor may read out the left-most matrix column-wise to the output buffer as an interleaved set of NM samples. After its values are copied to an output buffer as the interleaver output, the matrix may be considered uninitialized and re-used for the interleaving of subsequent samples.

Figure 1B:
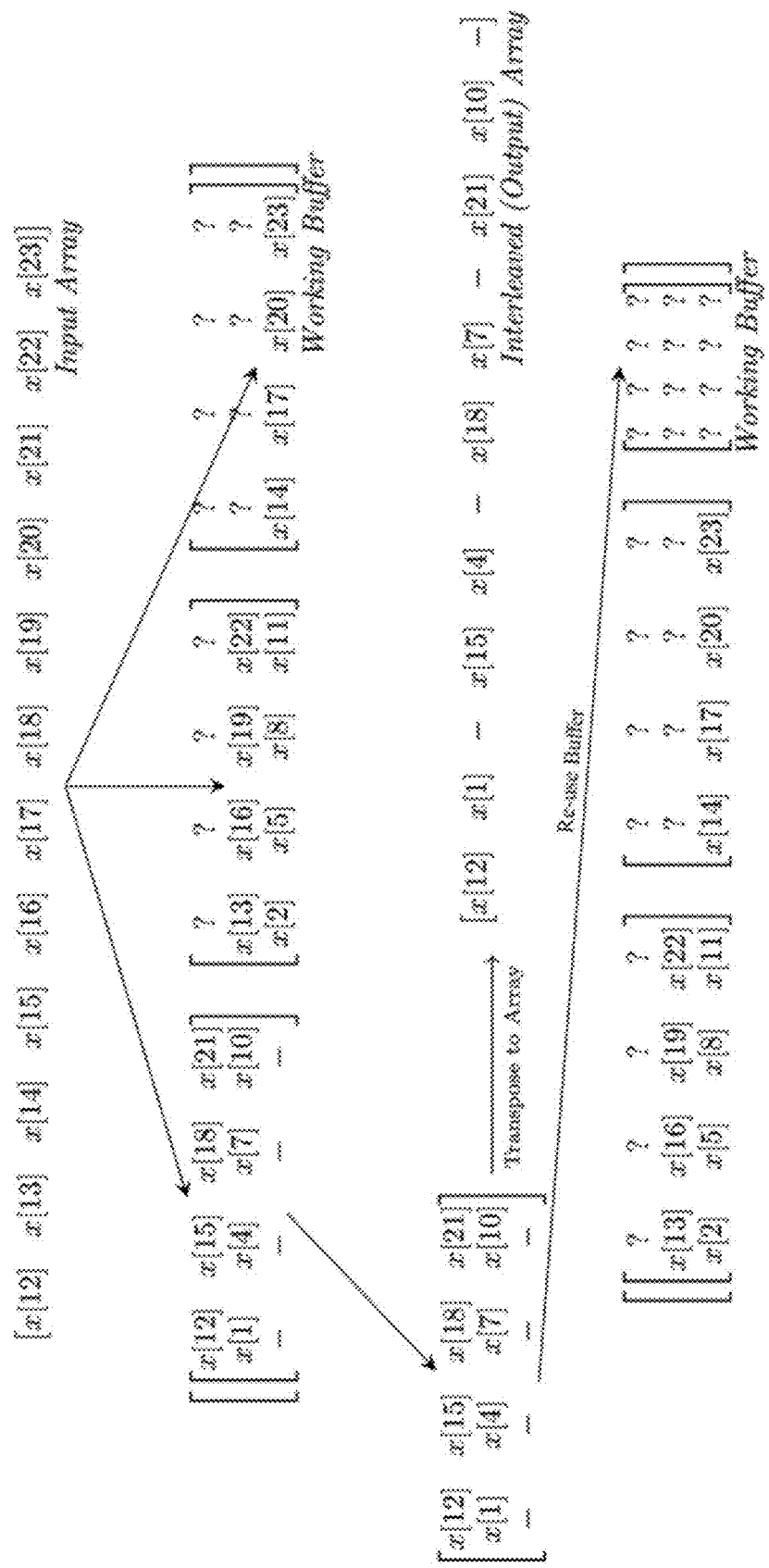

For example, FIGS. 1A-1C schematically illustrate example operations for forming a stream of convolutionally interleaved samples of a signal using software. The operations may be stored within a non-volatile computer-readable medium, and may performed by at least one computer processor core in operable communication with a memory and that is configured to implement the instructions set forth in the computer-readable medium. In the nonlimiting example illustrated in FIG. 1A, the processor core may receive a stream of time ordered samples of a signal, which may be represented as x[0], x[1], x[2], . . . . Each of the samples may be represented as a bit, or a multiple-bit sequence such as an LLR (log-likelihood-ratio), byte, word (e.g., 32, 64, 128 bit word), or even a complex-valued symbol. For the deinterleaving, the samples typically represent log-likelihood-ratios (LLRs). The interleaving or deinterleaving operation can be performed on any other data types that a processor core may support.

The processor core may write a fixed-size subset of those samples to a vector within a buffer, which subset may be represented as input array [x[0] x[1] x[2] . . . x[11]]. The processor core then may write that subset of the samples to different memory blocks in such a manner that temporally adjacent samples are written to different memory blocks than one another, and at least some non-temporally adjacent samples are written to the same memory blocks as one another. For example, in a manner such as illustrated in FIG. 1A (and similarly as described with reference to the set of fixed-sized M×N matrices described above), the processor core may write sample x[0] to a first matrix (a first memory block). The processor core may write sample x[1], which is temporally adjacent to sample x[0], to a second matrix (a second memory block). The processor core may write sample x[2], which is temporally adjacent to sample x[1], to a third matrix (a third memory block). The processor core may write sample x[3], which is temporally adjacent to sample x[2], to the first matrix, and so on. As such, none of the samples x[0], x[3], x[6], x[9], . . . written to the first matrix may be temporally adjacent to one another, none of the samples x[1], x[4], x[7], x[10], . . . written to the second matrix may be temporally adjacent to one another, and so on.

Part of the interleaving operation derives from internally shifting the locations to which temporally adjacent samples are written within different ones of the matrices (memory blocks). For example, the write procedure implemented by the processor may include, in a first memory block, writing a first sample of the subset to a first location; in a second memory block, writing a second sample of the subset to a first location that is shifted within the second memory block relative to the first location within the first memory block; and in a third memory block, writing a third sample of the subset to a first location that is shifted within the third memory block relative to the first location within the first memory block and relative to the first location within the second memory block. For example, it may be seen in FIG. 1A that sample x[0] is written to the first row of the first matrix, sample x[1] is written to the second row of the second matrix, and sample x[2] is written to the third row of the third matrix. In examples in which each of the memory blocks is of dimension MN, the first location to which the first sample is written within the first memory block is $M_iN_j$; the first location to which the second sample is written within the second memory block is $M_{i+2}N_j$; and the first location to which the third sample is written within the third memory block is $M_{i+2}N_j$.

Similarly, it may be seen in FIG. 1A that sample x[4] is written to the first row of the first matrix, sample x[5] is written to the second row of the second matrix, and sample x[6] is written to the third row of the third matrix. It will be appreciated that in examples with greater numbers of memory blocks, the fourth, fifth, and sixth (and a limited, predefined number of subsequent) samples may be written to fourth, fifth, and sixth (and a limited, predefined number of subsequent) matrices, rather than starting over at the first matrix as shown in FIG. 1A for space-conserving, purely illustrative reasons. The locations to which the processor core may write other samples within the input array to the various memory blocks readily may be inferred from the teachings herein. For example, these locations can be concisely defined using the following set of equations to address into the three-dimensional array indexed by i, j, k, and in which the input sample number is denoted by 'n', modulo operation is noted by '%' and integer division is denoted by '//':

$$h=((n\% \ N)*M)+((n//N)\% \ M)+(M*N*(n//(M*N)))$$

$$i=(h+(h//(N*M)))\% \ M$$

$$j=h\% \ M$$

$$k=(h//M)\% \ N$$

working_buffer[i,j,k]=input_buffer[h]

The operations for implementing the deinterleaver are almost identical, with only the first index into the working buffer 'i' changing:

$$h=((n\% \ N)*M)+((n//N)\% \ M)+(M*N*(n//(M*N)))$$

$$i=M-1-((h-(h//(N*M)))\% \ M)$$

$$j=h\% \ M$$

$$k=(h//M)\% \ N$$

working_buffer[i,j,k]=input_buffer[h]

The indexing arithmetic described above can be efficiently implemented using either the operations as specified (e.g., division and modulo) or by incrementing internal counters by one and checking when the counter reaches the modulo value. A skilled practitioner can easily determine which of these approaches results in higher throughput.

The computer processor then may generate a vector by reading out the samples from at least one of the memory blocks. For example, in a manner such as illustrated in FIG. 1A, the processor may read out the samples from the first matrix in a different order than the order in which they were written to the first matrix, e.g., may transpose and vectorize the matrix so as to generate the interleaved output array [x[0]--x[3]--x[6]--x[9]], where - indicates that the sample will be discarded by the deinterleaver and therefore may be set to zero, a garbage value, or left uninitialized. The processor may implement such read operation responsive to a respective row of that memory block being respectively filled with the samples of the subset being written to it, for example after row $M_i$ is filled in the first matrix. The processor then may repeat the writing and reading operations for additional subsets of the samples and additional memory blocks to generate a sequence of vectors forming a stream of convolutionally interleaved samples of the signal.

For example, as illustrated in FIG. 1A, after the processor core reads out the samples that had been stored within the first matrix, it may reuse the first matrix to store values of additional samples received in the input buffer. In this regard, it should be appreciated that the particular designation of a matrix (memory block) as being "first," "second," and the like is arbitrary and may change from operation to operation. As illustrated in FIG. 1B, which is a continuation of FIG. 1A, the processor core may write another fixed-size subset of those samples to a vector within the buffer, referred to in FIG. 1B as input array [x[12] x[13] [x14] . . . x[23]]. The processor core then may write the subset of the samples to memory blocks such that temporally adjacent samples are written to different memory blocks than one another, and at least some non-temporally adjacent samples are written to the same memory blocks as one another in a manner similar to that described with reference to FIG. 1A.

The computer processor then may generate another vector by reading out the samples from at least one of the memory blocks in an order that is different from how those samples were written. For example, in a manner such as illustrated in FIG. 1B, the processor may read out the samples from the matrix storing samples x[1], x[4], x[7], . . . (which matrix was referred to in FIG. 1A as the second matrix) in a different order than the order in which they were written to the first matrix, e.g., may transpose and vectorize the matrix so as to generate the interleaved (output) array [x[12] x[1]-x[15] x[4]-x[21]x[10]-]. The processor may implement such read operation responsive to a respective row of that memory block being respectively filled with the samples of the subset being written to it, for example after row $M_{i+1}$ is filled in the second matrix. The processor then may continue to repeat the writing and reading operations for still further additional subsets of the samples and additional memory blocks to generate a sequence of vectors forming a stream of convolutionally interleaved samples of the signal, e.g., in a manner such as continued in FIGS. 1B and 1C. For example, in a manner such as illustrated in FIG. 1C, the processor may implement another read operation after row $M_{i+2}$ is filled in the third matrix. Note that the interleaved (output) array illustrated in FIG. 1C lacks uninitialized values -, because a sufficient number of fixed-size subsets of input samples had been processed over the course of the preceding operations to completely fill the matrix that the processor reads out to generate the interleaved (output) array, whereas the interleaved arrays illustrated in FIGS. 1A and 1B are generated relatively early in the process flow and therefore the corresponding matrices being read out are only partially filled with samples, whereas later read operations are of matrices that are completely filled with samples.

Figure 2:
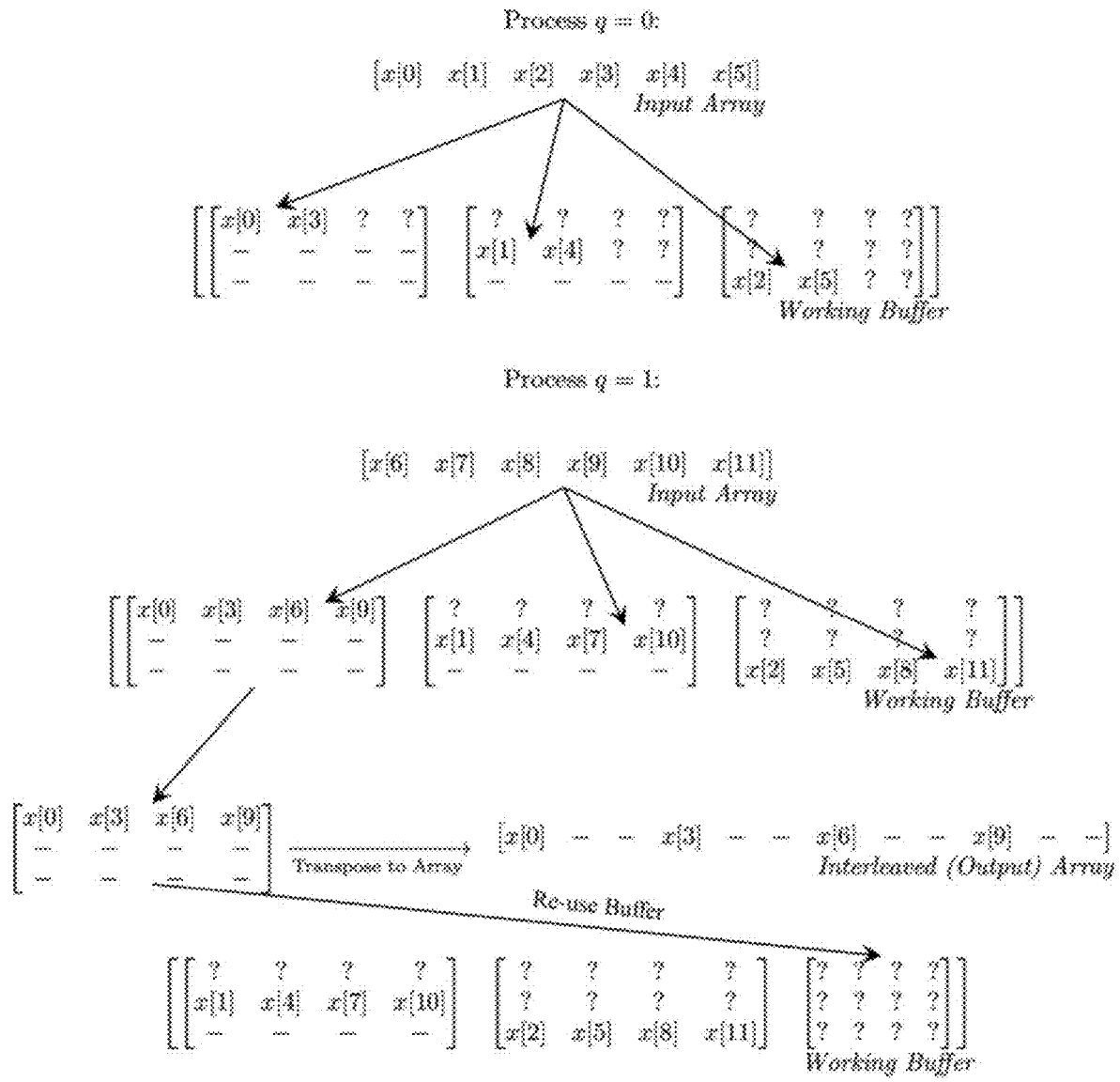
FIG. 2 schematically illustrates example operations for forming a stream of convolutionally interleaved samples of a signal using software.

It will be appreciated that the sizes of the input array and interleaved (output) array suitably may be selected so as to enhance the efficiency and throughput of the processing core with cache. For example, the size of the subset of the samples that are stored in the memory blocks within a given operation may be selected to fit entirely within the cache. Although the nonlimiting example illustrated in FIGS. 1A-1C includes input arrays having twelve elements, modern hardware caches readily may accept and efficiently process input arrays with millions of elements. As noted elsewhere herein, there may, however, be constraints on the dimensions of elements stored within the hardware cache(s). For example, the size of the subset of the samples (input array) may be evenly divisible by N, such that each of the matrices receives the same integer number of samples as one another during each write operation. Additionally, in a manner such as described in greater detail below with reference to FIG. 2, the particular number of samples that is written in a given operation may be suitably adjusted so as to enhance the throughput of the write operation. Additionally, in a manner such as described in greater detail below with reference to FIGS. 3A-3B, the write and read operations may be divided among a number of processor cores so as to enhance the throughput of these operations.

The present inventors have recognized that the present matrix-type representation of the convolutional interleaver operation translates well to the memory architecture of a general-purpose CPU. Initial implementations successfully used this approach, with the matrices shown in FIGS. 1A-1C with different M, N parameters represented as a single two-dimensional array of size NM×M, which may be referred to as the "working buffer". The present design represents the working buffer as a three-dimensional array in matrix, row, column order to allow usage of accelerated linear algebra functions. In a manner such as described further below in the working examples, all tested interleaver sizes fit comfortably in the main memory of the test systems used, and performance was dramatically improved over the shift register design for smaller interleavers (N<4,000), reaching over 1 GS/s with each input bit stored as a byte. The present inventors recognized that for larger interleavers, e.g., N=10,000-100,000, adjustment of additional parameter(s) may be used to provide enhanced performance, e.g., in a manner such as described with reference to FIGS. 2 and 3A-3B.

Interleaver Optimization Parameter (Q)

The present inventors recognized that for larger interleavers, the design described with reference to FIGS. 1A-1C may be modified to increase the probability of cache hits. This led to the optimization parameter, Q, which can be chosen in such a manner that large interleavers achieve the same >1 GS/s performance seen for small interleaver sizes. The Q parameter, in the context of the present application, defines the number of input samples written to each row of the working buffer before moving to the next row (and next matrix). Choosing Q such that each matrix row of length N is split into a set of uniform-length chunks results in simple and more efficient implementation. For these reasons, Q may be constrained such that $1 \leq Q \leq N$, and Q evenly divides N (mod(N, Q)=0). To ensure the entire input buffer is used, the software may keep track of which section of the row to operate on such that it eventually iterates through an entire row of each matrix. This intra-row index is labelled q and has a range $0 \leq q < N/Q$. An example of the implementation of the Q parameter can be shown FIG. 2, which illustrates a set of convolutional interleaving operations similar to those described with reference to FIGS. 1A-1C, and for which Q=2, M=3, N=4, such that two samples are written into each of the matrices during each write operation (as compared to four samples in FIGS. 1A-1C). While the effect on achievable throughput is negligible for the small interleaver size shown, with large interleavers, the range constraints for the input array have demonstrable impact. The effectiveness of the Q parameter is best explained by a balance between pointer arithmetic overhead and likelihood of a cache "hit" in the input buffer.

At its extremes, Q=1 leads to a single write per row before iterating to the next row of the next matrix. This is quite a bit of pointer arithmetic, especially as the row index is reset every M samples. Given that pointer arithmetic is a bottleneck form small values of Q, throughput tests for Q=1 are constant across all values of N, as expected. It was observed that a significant amount of expensive pointer arithmetic was used when Q=1, M=128, N=100,000, including frequent integer multiply operations. In contrast, comparatively little pointer arithmetic was observed to be needed for Q=1,000, M=128, N=100,000, with faster sample memory movement due to frequent cache hits, leading to dramatically less CPU time used to interleave the same number of samples.

On the other end of the range of possible values of Q, Q=N leads to identical behavior to the implementation described with reference to FIGS. 1A-1C, in which a row is completely written per matrix before moving onto the next. This may cause lower throughput for large interleavers for which the input array—which the processor copies into the working buffer's row across its entire range with a step of M samples—cannot completely fit in the cache. This wide range, processed sequentially, may lead to the eviction of the beginning of the input buffer from the hardware cache by the time the end of the input buffer is reached for that row. On the next row, the process starts over, such that the beginning of the input buffer is re-fetched from the slow external memory. This repeated fetching from external memory explains the initial interleaver implementation's poor performance for large interleaver sizes. Whereas small interleavers may fit entirely in cache, large interleavers may involve continuously fetching from main memory.

This reduced cache performance without the Q parameter (or, equivalently, Q=N) was demonstrated during performance profiling with Intel's VTune software. A large interleaver with parameters M=100, N=100,000 was chosen for demonstration. Memory and cache statistics were gathered for two runs of the same convolutional interleaver implementation for the same number of samples. Results for the primary worker function Q=1,000 and Q=100,000 are shown in Table 1 and clearly demonstrate a cache hit probability improvement and, by extension, a lower average memory access latency.

TABLE 1

Caching statistics for interleaver M = 100,
N = 100,000 comparing Q = N (no Q parameter)
against Q = 1,000 (optimized Q parameter) on AMD EPYC 7502P

| Measurement | Q = N = 100,000 | Q = 1,000 |
|---|---|---|
| Total Loads | 9.7 Billion | 9.6 Billion |
| Total Stores | 3.2 Billion | 3.2 Billion |
| L3 Cache Misses | 1.3 Billion | 19.6 Million |
| Avg. Access Latency | 104 cycles | 11 cycles |

The present inventors recognized that a properly tuned Q parameter (e.g., 400≤Q≤4000, depending on cache size) may split up the input buffer to balance the two extremes. For example, handling hundreds of input samples at a time may dramatically reduce the pointer math overhead, while limiting the size of the input buffer may maintain the relevant samples in cache. As a result, while the initial implementation only surpassed >1 GS/s performance for small interleavers, adding and tuning the Q parameter extended this performance to large interleavers up to and including N=100,000.

Multi-Threaded Interleaver Implementation

Figure 3A:
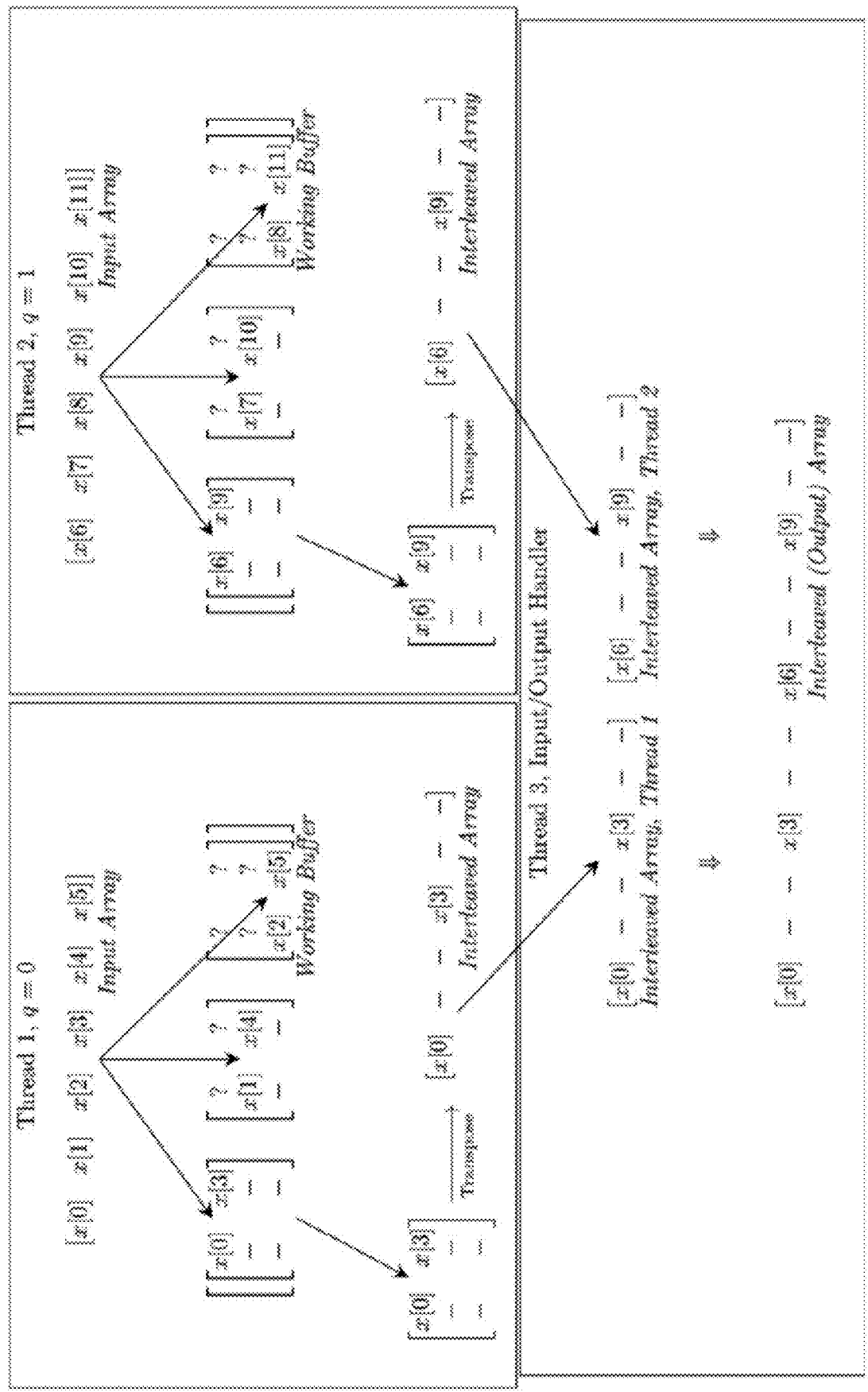
FIGS. 3A-3B schematically illustrates example operations for forming a stream of convolutionally interleaved samples of a signal using software implemented by multiple processor cores.

Further, or alternative, alterations to the operations described with reference to FIGS. 1A-1C may be used to enhance throughput, such as adapting such operations for use in a multi-threaded (e.g., multiple-processor-core) convolutional interleaver. Desirably, a multi-threaded interleaver design may use relatively low amounts of inter-thread synchronization, and almost no increase in memory usage. The present inventors recognized that the chunks of work split by q were operating on non-overlapping memory spaces in the working buffer, and that a multithreaded architecture for the interleaver similarly may be implemented by splitting work across multiple threads by values of q. For example, FIG. 3A illustrates a multi-threaded modification of the example illustrated in FIG. 2, also including an interleaver with parameters M=3, N=4, Q=2 and in which one thread of the program (processor core) may handle the interleaving of the portion of the input buffer for which q=0 and another thread may interleave for q=1, enabling the two sets of q processes to be handled in parallel by different threads or different processor cores. Note that the working buffer is now split on a per-thread basis, such that the different threads may read and write to different, non-overlapping portions of memory than one another. For example, a portion of the write and read operations described with reference to FIGS. 1A-1C may be performed by a first processor, and another portion of the write and read operations described with reference to FIGS. 1A-1C may be performed by a second processor core. It will be appreciated that any suitable number of threads (typ. less than or equal to the number processor cores) may be used to implement any suitable portions of the read and write operations in a manner similar to that illustrated in FIG. 3A.

Figure 11:
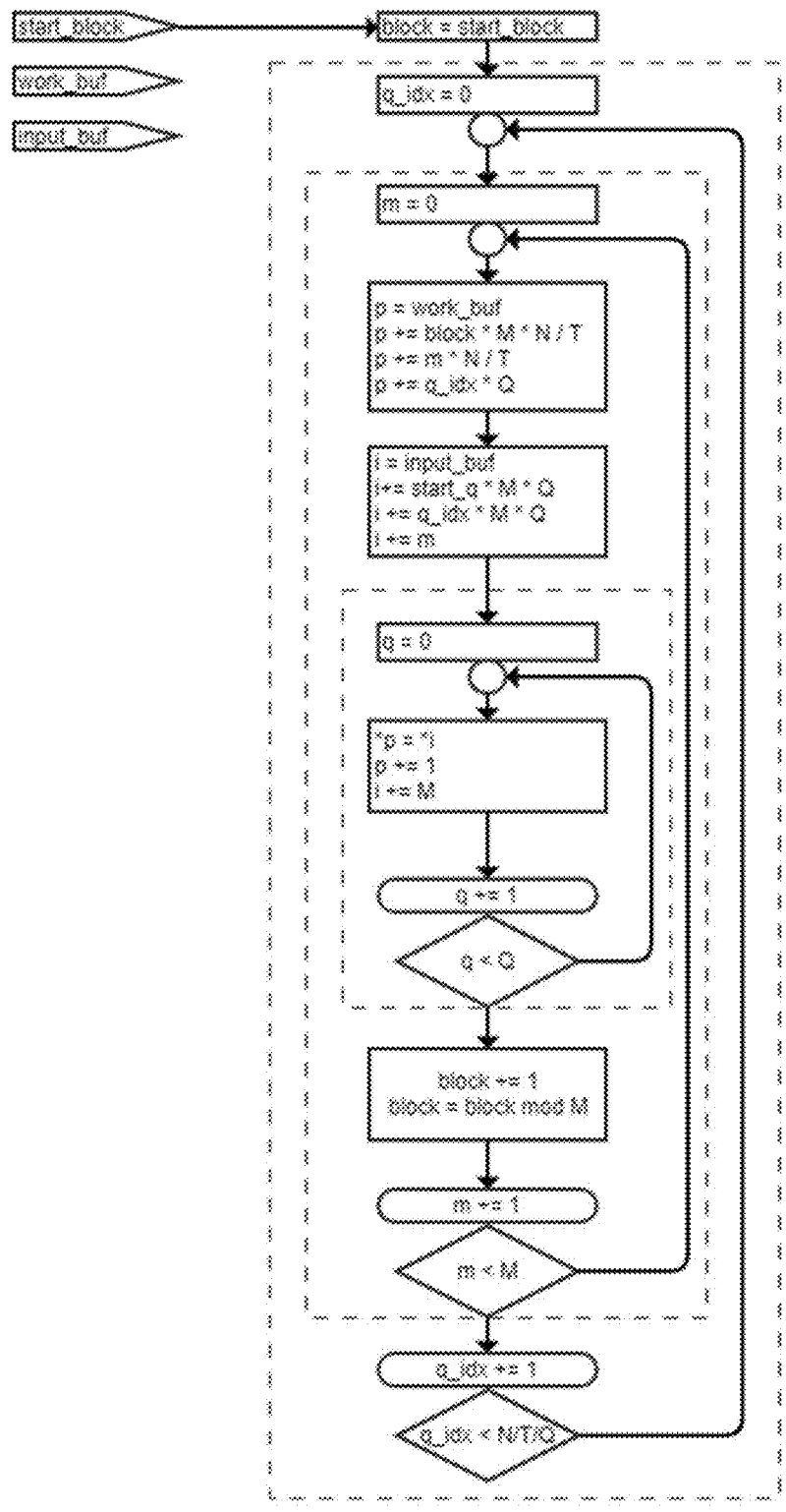

The method described above may be understood by referring to FIGS. 11 and 12. These figures show operations performed in each of the T processing threads. The outer loop performs the same operation N/T/Q times. Each operation processes MQ samples. The total number of samples processed across all threads is then N/T/Q*T*MQ=MN. The second loop processes M rows. The inner loop processes Q samples, copying samples from the input buffer to the working buffer.

Figure 3B:
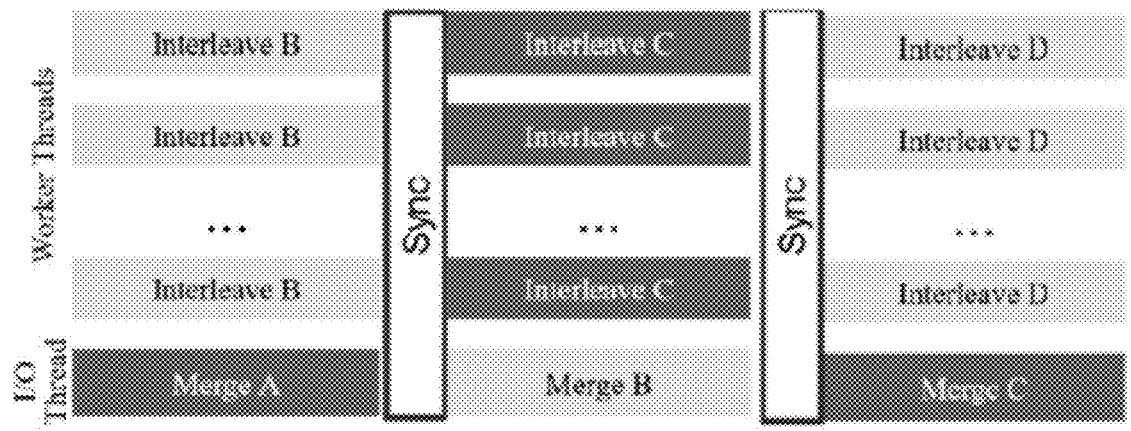

An additional (e.g., third), with the first two threads being the ones described above, known as the input/output synchronization, may be used to provide the input arrays to the different threads, and to receive and concatenate the interleaved vectors from the different threads, in a manner such as illustrated in FIG. 3A, using synchronization events such as illustrated in FIG. 3B. For example, a third processor core may receive the vector of the samples generated in the read operation by the first processor core and the vector of the samples generated in the read operation from the second processor core. In a manner such as illustrated in FIG. 3A, the third processor core may merge (concatenate) such vectors to generate a portion of a stream of convolutionally interleaved samples of the signal. In a manner such as illustrated in FIG. 3B, the third processor core may output to the first processor core a portion of one of the additional subsets of the samples (a portion of the input array) and may output to the second processor core another portion of one of the additional subsets of the samples (another portion of the input array). In a manner such as illustrated in FIG. 3B, the third processor may repeat the merge and output operations, synchronously with the write and read operations performed by the first and second processor cores, for the additional subsets of the samples.

Some additional adaptations to the design may be implemented so to enhance operation with multiple threads. For example, for T threads, the working buffer may be split into T contiguous, non-overlapping address spaces, rather than allocating a single buffer of size MNM to be shared between threads. While the various sections of the working buffer per q may be non-overlapping, each thread may not necessarily see a contiguous address space for a single large working buffer. This may cause an issue in multi-threaded software, as a write to a cache entry (typ. 512 bits) shared by multiple threads may cause an eviction in all thread-local caches that share that data. These computationally expensive evictions exist to help all threads to stay synchronized with the latest data but have a performance impact and are avoided when possible. Allocating a separate working buffer per-thread solves this issue completely, and as the buffers are non-overlapping, there is zero increase in the amount of system memory used to interleave the data. The memory complexity of the interleaver simply went from 1×MNM to T×(MNM/T).

In addition, or alternatively, double buffering of the per-thread interleaved outputs may be used to prevent or inhibit a single-thread bottleneck as the interleaved results are merged (e.g., by an input/output handler that concatenates interleaved vectors output by other threads in a manner such as described with reference to FIGS. 3A-3B). Such merging may be a single-threaded operation and performed after other threads have completed their interleaving work. However, stalling during a single thread merge operation may present a serious throughput bottleneck. The present inventors recognized that the coordination thread (Input/Output Handler in FIGS. 3A-3B) may use two sets of buffers for each thread's interleaved output. On each set of input samples, the coordination thread may dispatch the input array to each thread, merge (concatenate) the results from the previous set of samples while the threads are performing interleaving, and then return after each thread has signaled interleaving to be complete. This approach may provide that every thread is maximally loaded by performing more work in parallel. A timeline demonstrating this parallel work is shown in FIG. 3B.

The multi-threaded convolutional interleaver design's performance, including the division of the working buffer and the use of double-buffering such as described above, is robust and fast. An instance with a single worker thread (T=1) saw almost no performance degradation as compared with the single-threaded version, and multi-threaded performance scaling was exceptional. For example, increasing the thread count led to interleaver performance improvements up to T=16 on a 32-core (64-thread) single-CPU system. The highest benchmarked throughput to date is over 8 Gigasamples per second (GS/s), using byte-sized samples containing one bit each. Further benchmarks were performed to more rigorously analyze performance across various configurations, in a manner such as described in the Working Examples.

Figure 4:
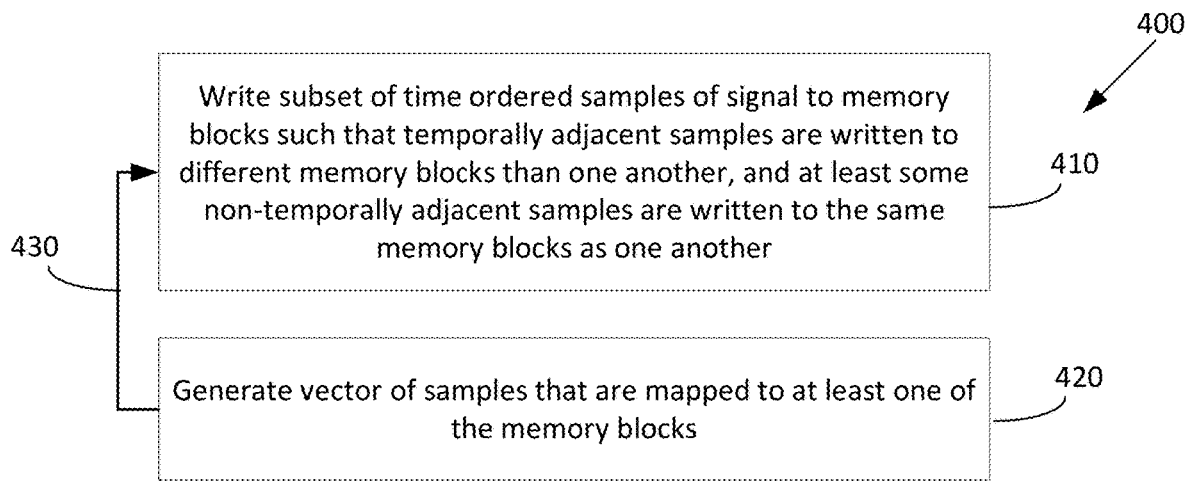
FIG. 4 illustrates an example flow of operations in a method for forming a stream of convolutionally interleaved samples of a signal using software.

It will be appreciated that high-throughput, software-defined convolutional interleavers such as described with reference to FIGS. 1A-1C, 2, and 3 may be used in any suitable method for processing samples of a signal. For example, FIG. 4 illustrates an example flow of operations in a method for forming a stream of convolutionally interleaved samples of a signal using software. Method 400 illustrated in FIG. 4 may be performed by at least one computer processor core in operable communication with a memory, e.g., may be performed by a single processor core with cache in a manner such as described with reference to FIGS. 1A-1C and 2, or may be performed by multiple processor cores with caches in a manner such as described with reference to FIGS. 3A-3B.

Method 400 illustrated in FIG. 4 may include writing a subset of time-ordered samples to memory blocks such that temporally adjacent samples are written to different memory blocks than one another, and at least some non-temporally adjacent samples are written to the same memory blocks as one another (operation 410). Such a write operation may be performed by a single processor core in a manner such as described with reference to FIGS. 1A-1C or FIG. 2, or may be performed by multiple processor cores in a manner such as described with reference to FIGS. 3A-3B. Method 400 illustrated in FIG. 4 further may include generating a vector by reading out the samples from at least one of the memory blocks (operation 420). Such a read operation may be performed by a single processor core in a manner such as described with reference to FIGS. 1A-1C or FIG. 2, or may be performed by multiple processor cores in a manner such as described with reference to FIGS. 3A-3B. In examples in which the read operation is performed by multiple processor cores, the vectors from the different cores may be merged by another processor core, e.g., an input/output manager such as described above with reference to FIGS. 3A-3B. Method 400 illustrated in FIG. 4 further may include repeating operations 410 and 420 for additional subsets of the samples and additional memory blocks to generate a sequence of vectors forming a stream of convolutionally interleaved samples of the signal (operation 430).

Figure 5:
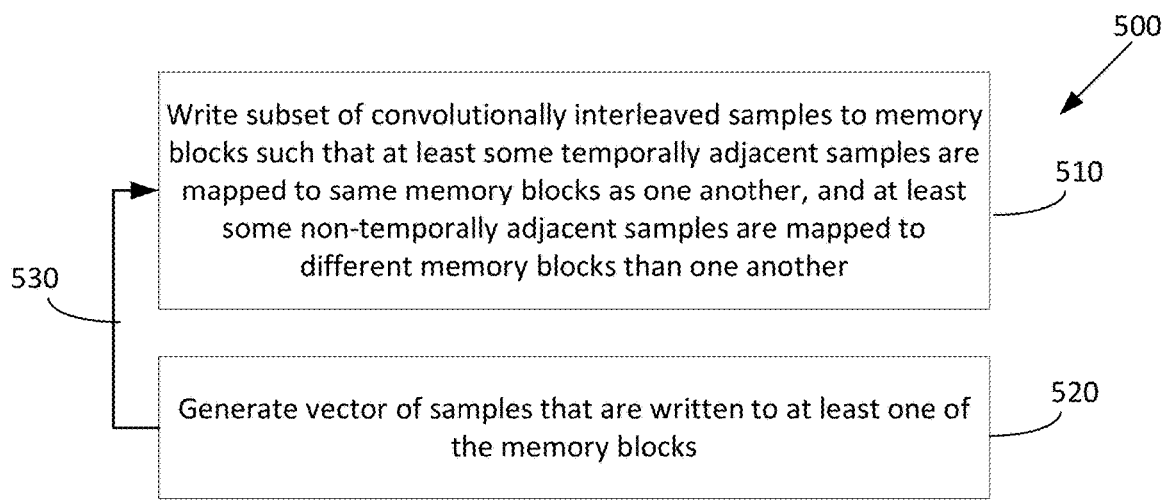
FIG. 5 illustrates an example flow of operations in a method for de-interleaving a stream of convolutionally interleaved samples of a signal using software.

It will further be appreciated that operations performed by the high-throughput, software-defined convolutional interleavers such as described with reference to FIGS. 1A-1C, 2, and 3 may be performed in the reverse order in such a manner as to provide a high-throughput, software-defined convolutional de-interleaver. For example, FIG. 5 illustrates an example flow of operations in a method for de-interleaving a stream of convolutionally interleaved samples of a signal using software. Method 500 illustrated in FIG. 5 may be performed by at least one computer processor core in operable communication with a memory, e.g., may be performed by a single processor core in communication with cache in a manner similar to that described with reference to FIGS. 1A-1C and 2, or may be performed by multiple processor cores with caches in a manner similar to that described with reference to FIGS. 3A-3B.

Method 500 illustrated in FIG. 5 may include writing a subset of the convolutionally interleaved samples to memory blocks such that at least some temporally adjacent samples are written to the same memory blocks as one another, and at least some non-temporally adjacent samples are written to different memory blocks as one another (operation 510). Such a write operation may be performed by a single processor core in a manner such as described with reference to FIGS. 1A-1C or FIG. 2, or may be performed by multiple processor cores in a manner such as described with reference to FIGS. 3A-3B. Method 500 illustrated in FIG. 5 may include generating a vector by reading out the samples from at least one of the memory blocks (operation 520). Such a read operation may be performed by a single processor core in a manner similar to that described with reference to FIGS. 1A-1C or FIG. 2, or may be performed by multiple processor cores in a manner similar to that described with reference to FIGS. 3A-3B. In examples in which the read operation is performed by multiple processor cores, the vectors from the different cores may be merged by another processor core, e.g., an input/output manager similar to that described above with reference to FIGS. 3A-3B. Method 500 illustrated in FIG. 5 may include repeating operations 510 and for additional subsets of the samples and additional memory blocks to generate a sequence of vectors forming a stream of time ordered samples of the signal (operation 530).

It will further be appreciated that the present convolutional interleavers may be used together with the present convolutional de-interleavers. Alternatively, the present convolutional interleavers suitably may be used with any convolutional de-interleaver, and the present convolutional de-interleavers suitably may be used with any convolutional interleaver. That is, the present convolutional interleavers and de-interleavers may be used to perform any desired convolutional interleaving algorithm satisfying any standard, via suitable selection of the parameters M and N satisfying equations 1-3.

It will additionally be appreciated that whereas hardware-implemented convolutional interleavers and de-interleavers may be redesigned and replaced or rebuilt in order to implement any different interleaver parameters, the software implementing the present interleavers and de-interleavers readily may be revised to accommodate any different parameters. Indeed, different instances of the software may be used on the same machine in order to process samples that are interleaved with different sets of parameters, which may be a particularly useful feature for software defined radio (SDR).

WORKING EXAMPLES

The following examples are intended to be purely illustrative, and not limiting of the present subject matter.

The multi-threaded convolutional interleaver implementation described with reference to FIGS. 3A-3B was verified using an external set of verification functions. These functions used an incrementing counter as a data source, with a data sink checking that each sample of the interleaved output matched expectations according to the interleaving system defined in Equations 1-3. A high level of confidence is held in this validation methodology as it was used throughout several iterations of the convolutional interleaver software. However, generating an incrementing counter and calculated the expected output sample value are computationally expensive and quickly bottleneck the convolutional interleaver software. Thus, benchmarking and validation were performed separately against the same code base so that validation code did not affect the throughput measurement. Each presented benchmark separately passed validation.

Benchmarking was performed on two separate high-performance 64-bit x86 computers running Ubuntu 18.04, having the specifications listed in Table 2. The software was written entirely in C++17 (IPP used for fast matrix transpose) and built using g++v7.5.0 with the -O3 and -march=native flags.

TABLE 2

Convolutional interleaver benchmarking system specifications

| System | Intel Workstation | AMD Server |
|---|---|---|
| Processor | Xeon W-2135 | Epyc 7502P |
| Base Clock | 3.7 GHz | 2.5 GHz |
| Boost Clock | 4.5 GHz | 3.35 GHz |
| Cores/Threads | 6/12 | 32/64 |
| L3 Cache | 8 MB | 128 MB[1] |
| RAM (DDR4) | 8 × 32 GB @2666 | 8 × 8 GB @3200 |

[1]AMD Zen 2 L3 cache (as is in the Epyc 7502P) is split across multiple core complexes (CCX); each CCX has direct access to 16 MB of the cache.

The parameters for benchmark tests were chosen such to be representative of high-rate communications systems and such that the maximum number of options for T were valid given the existing constraint mod (N, Q)=0; mod(Q,T)=0.

Two specific sets of interleaver parameters were chosen: a very large interleaver M=256, N=120,000, Q=500 and a smaller interleaver for M=100, N=8,000, Q=400. The results may be considered representative of performance for similarly-sized interleavers on an identical system—for example, the performance results graphed for M=256, N=120,000, Q=500 are demonstrably similar to that of M=200, N=100,000, Q=1000. There was no noticeable advantage to using powers of two for any parameter.

Initial benchmarking was performed for a legacy, single-threaded ringbuffer implementation. This specific implementation has a small optimization to copy input and output values in cache-friendly chunks. While the memory utilization of this implementation is lower than the presented multi-threaded implementation, throughput figures are inadequate as shown in Table 3.

TABLE 3

Benchmarking results for two systems running a single-threaded ringbuffer-backed convolutional interleaver implementation.

| System | Intel Workstation | AMD Server |
|---|---|---|
| Large Interleaver | 108 MS/s | 210 MS/s |
| Small Interleaver | 140 MS/s | 277 MS/s |

These same benchmarks were re-run for the present multi-threaded convolutional interleaver implementation. Multiple values of T were benchmarked to explore both the scaling with increasing numbers of threads as well as to find the absolute peak performance possible given each test system. FIGS. 6-10 are plots demonstrating the throughput of convolutionally interleaved samples using different processors and different parameters. Results are shown for the large interleaver in FIG. 6, which shows the measured throughput as a function of number of threads for M=256, N=120,000, Q=500, and for the small interleaver in FIG. 7, which shows the measured throughput as a function of number of threads for M=100, N=8,000, Q=400. Note that fewer datapoints are shown in FIG. 7 as fewer values of T exist satisfying the condition that N divides Q divides T for the parameters tested.

Figure 6:
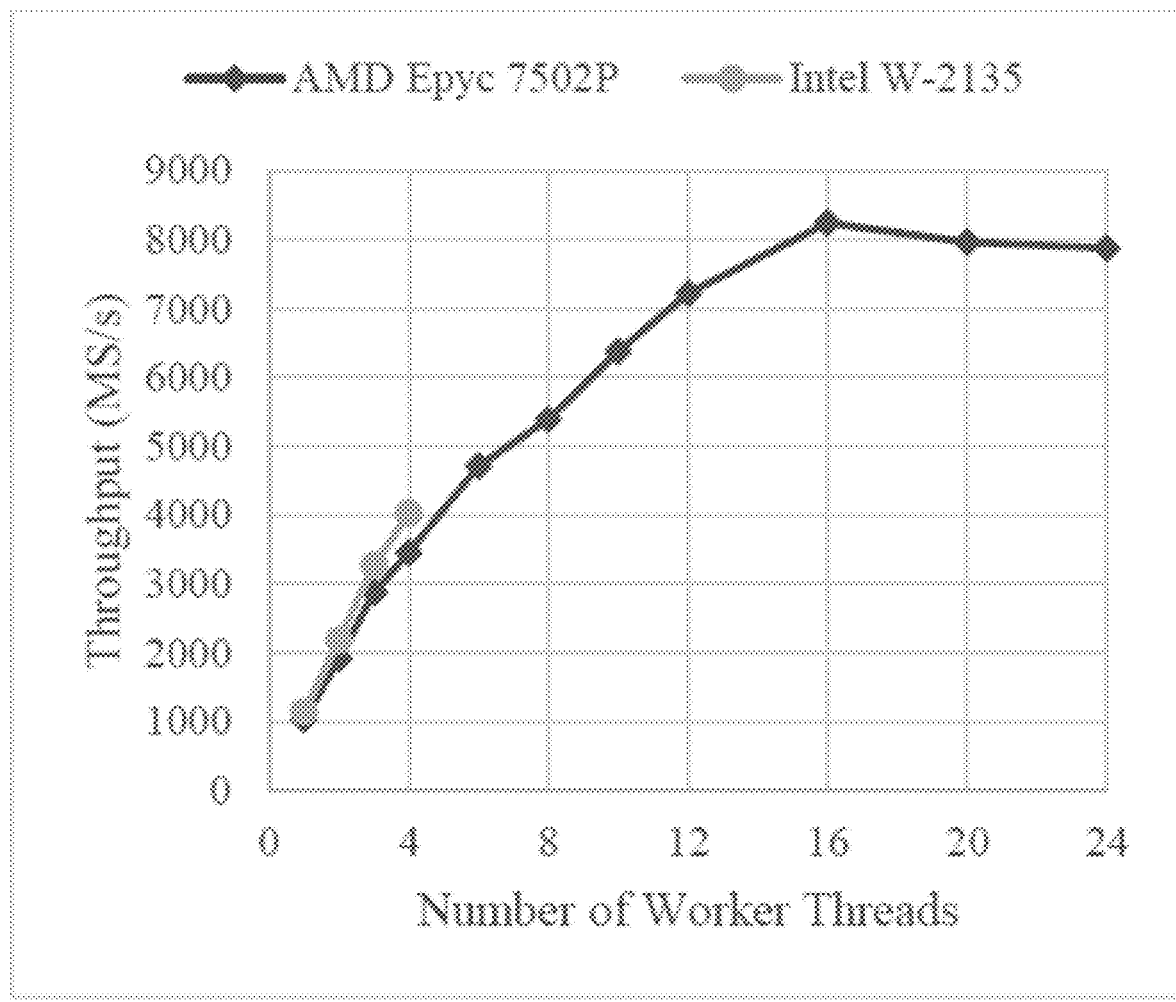
FIGS. 6-10 are plots demonstrating the throughput of convolutionally interleaved samples using different processors and different parameters.
Figure 7:
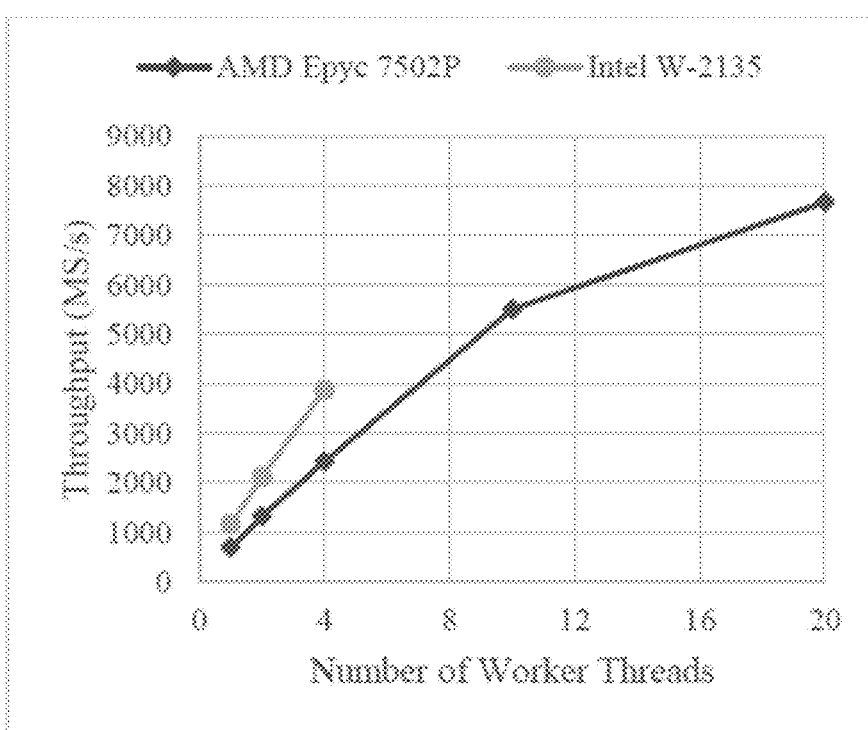

As can be seen in FIGS. 6 and 7, both the Intel and AMD systems showed relatively high throughput results (at least about 8,000 MS/s for each of the interleavers), with excellent scaling as the number of threads T increases. Results for T>4 were excluded from the Intel results, as two other threads were used (benchmarking thread, synchronization thread) and performance was severely hampered with simultaneous multi-threading (SMT, also known as Hyperthreading on Intel Processors) enabled on both systems. For an equivalent T, the Intel system had higher throughput, most notably for the smaller interleaver (FIG. 7) where the Intel system has a 42% lead. The higher clock speeds of the W-2135 helped throughput for lower values of T; however, the massive core count of the Epyc 7502P allowed the algorithm to scale to a total of 8,243 MS/s.

Figure 8:
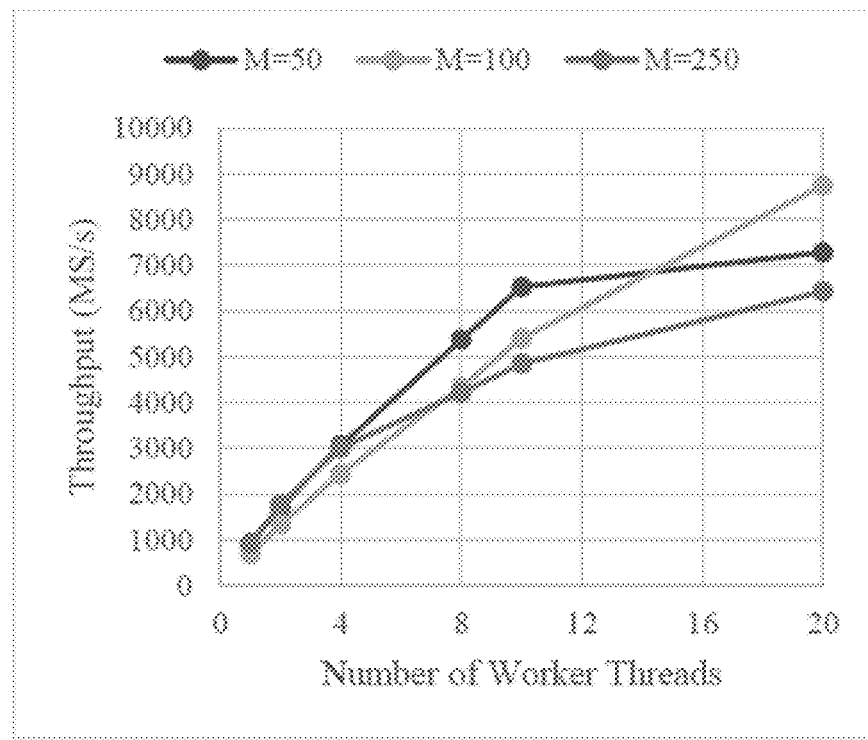
Figure 9:
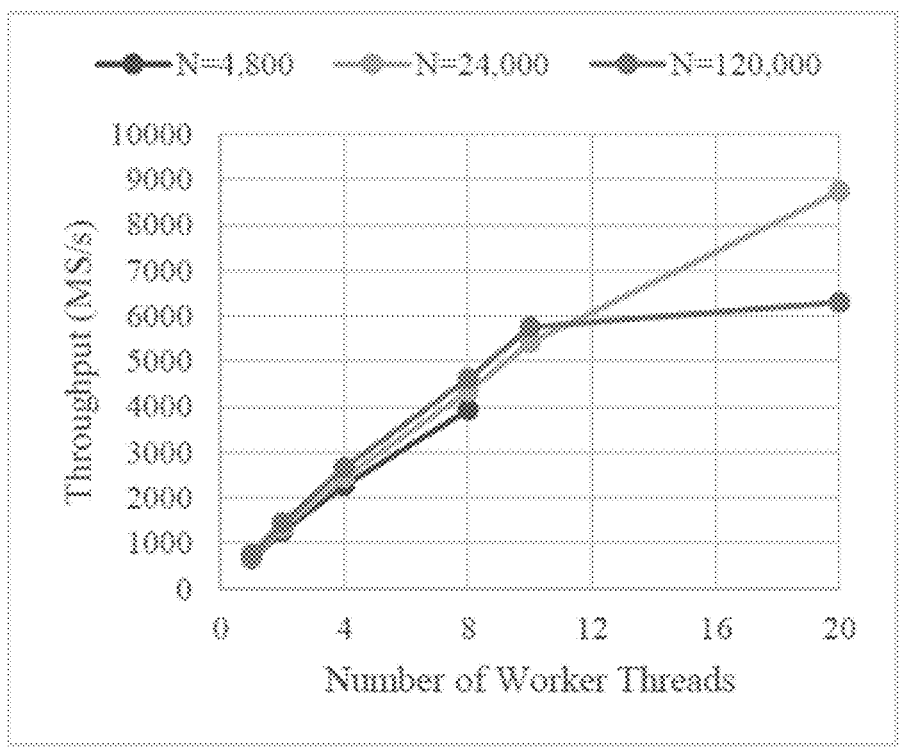

To test the flexibility of the algorithm, the throughput and multi-threaded scaling of multiple configurations of M and N were measured and are shown in FIGS. 8 and 9 respectively. More specifically, FIG. 8 illustrates throughput for the AMD system as a function of the number of threads and various values of M, for N=24,000, Q=600, and FIG. 9 illustrates throughput for the AMD system as a function of the number of threads and various values of N, for M=100, Q=600 These results demonstrate that, for the test system, configurations using 10 or fewer threads seem to be closely matched across various choices of M and N, and all tested configurations reached impressive speeds. In particular, M=100, N=24,000, Q=600 exhibited unusually good thread scaling, reaching a peak of 8,743 MS/s. It is expected that with further tuning of parameters and use of even more powerful processor cores, throughputs well in excess of 10,000 MS/s may be achieved.

The standalone results presented above were more than sufficient to satisfy the specifications of a software-defined LCRD (Laser Communications Relay Demonstration) modem with which the present interleaver may be used. In this example, the entire modem runs on the single AMD Epyc 7502P system as previously described. The C++ class defining the interleaving operation was ported to the larger codebase for the LCRD modem and tests were successfully re-run for validation.

Throughput testing of the integrated interleaver was performed by providing more than enough computing resources for all other parts of the flowgraph to ensure that only the interleaver could bottleneck the system. For example, the DVB-S2 encoder was given exclusive control of 6 CPU cores, which fed the interleaver with a ~2.8 Gbps encoded input data rate. The interleaver was chosen to have parameters (described below) that are close to that of an LCRD-compliant modem. Benchmarking started with one interleaving worker thread, and the number of threads was increased until the target throughput was achieved for the entire transmitter software component.

Figure 10:
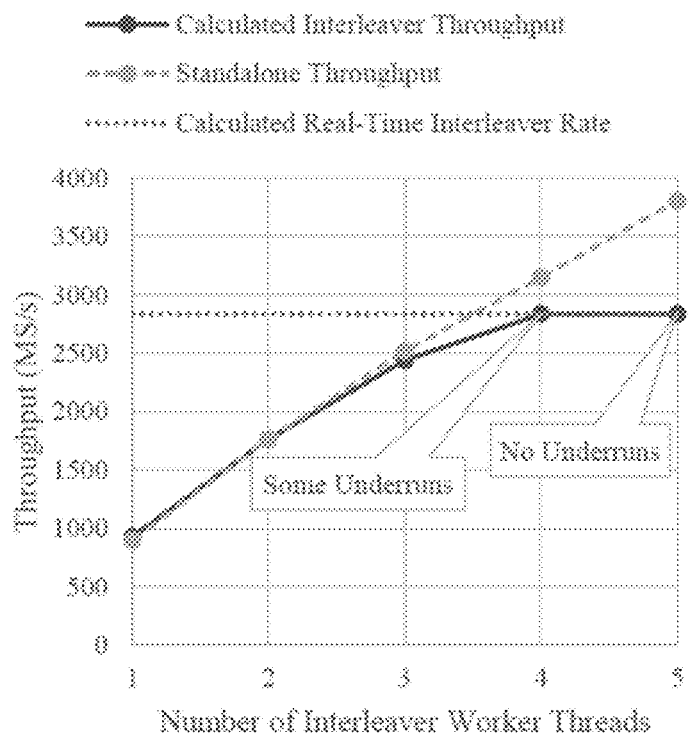

The results of FIG. 10, which illustrates the throughput of the present convolutional interleaver integrated into the LCRD modem as a function of the number of interleaver threads for M=150, N=30,000, Q=500, are derived from a measurement of the entire flowgraph, scaled by the ratio of interleaved bits to total bits in a frame. It is clearly shown that the target line rate of ~2.9 Gbps was achieved with T=4 threads and stable operation was achieved at T=5, indicating that the interleaved FEC blocks can be generated in real-time on the tested system leaving many cores to spare. Comparison against the performance of the standalone testbench run with the same parameters shows minimal impact from running other complex algorithms in parallel. This demonstrates that the presented interleaver not only has excellent performance in a standalone configuration, but also integrates well with a full software radio system on a single computer system.

Accordingly, provided herein is a novel implementation of the convolutional interleaving algorithm, re-framed as a series of memory-dense matrix operations. Further enhancements, such as the Q parameter and/or multi-threading architecture, further may improve performance. Verification methodology also is presented, and the results of benchmarks performed on a pair of modern, high performance x86 computers demonstrating consistently high throughput figures across multiple CPU architectures. Excellent thread scaling and peak performance >8 GS/s was measured, which more than met the specifications for an exemplary LCRD-compliant software-defined transmitter. Indeed, the present implementations provide throughput at least ten times faster than previously published implementations.

ALTERNATIVE EMBODIMENTS

While various illustrative embodiments of the invention are described above, it will be apparent to one skilled in the art that various changes and modifications can be made therein without departing from the invention. For example, it will be appreciated that the present convolutional interleavers may be implemented in any suitable modem, transmitter, or transceiver, and that the present convolutional de-interleavers may be implemented in any suitable modem, receiver, or transceiver. Illustratively, the present convolutional interleavers may be used in optical or radio frequency (RF) satellite communications, for commercial digital subscriber line (DSL) links, cable modems, personal communications services (PCS), satellite communications ground stations, reconfigurable base stations, or the like. The appended claims are intended to cover all such changes and modifications that fall within the true spirit and scope of the invention.

What is claimed:

1. A method for processing a stream of time ordered samples of a signal, the method being performed by at least one computer processor core in operable communication with memory, the method comprising:
    (a) writing a subset of the samples to memory blocks such that temporally adjacent samples are written to different memory blocks than one another, and at least some non-temporally adjacent samples are written to the same memory blocks as one another, wherein the memory includes M memory blocks each of dimension MN, where M is an integer equal to the number of rows in each of the memory blocks, and N is an integer equal to the number of columns in each of the memory blocks;
    (b) generating a vector by reading out the samples from at least one of the memory blocks, wherein operation (b) comprises transposing and vectorizing the at least one of the memory blocks; and
    (c) repeating operations (a) and (b) for additional subsets of the samples and additional memory blocks to generate a sequence of vectors forming a stream of convolutionally interleaved samples of the signal.

2. The method of claim 1, wherein a portion of operation (a) and a portion of operation (b) are performed by a first processor core, and another portion of operation (a) and another portion of operation (b) are performed by a second processor core.

3. The method of claim 2, further comprising, by a third processor core:
    (d) receiving the vector of the samples generated in operation (b) by the first processor core and the vector of the samples generated in operation (b) from the second processor core;
    (e) concatenating the vectors of operation (d) to generate a portion of the stream of convolutionally interleaved samples of the signal;
    (f) outputting to the first processor core a portion of one of the additional subsets of the samples and outputting to the second processor core another portion of one of the additional subsets of the samples; and
    (g) repeating operations (d) through (f), synchronously with operations (a) and (b), for the additional subsets of the samples.

4. The method of claim 1, wherein a size of the subset of the samples is selected to fit entirely within a cache of the at least one computer processor core.

5. The method of claim 1, wherein operation (a) comprises:
    in a first memory block, writing a first sample of the subset to a first location;
    in a second memory block, writing a second sample of the subset to a first location that is shifted within the second memory block relative to the first location within the first memory block; and in a third memory block, writing a third sample of the subset to a first location that is shifted within the third memory block relative to the first location within the first memory block and relative to the first location within the second memory block.

6. The method of claim 5, wherein:
the first location within the first memory block is in a row within the first memory block and a column within the first memory block;
the first location within the second memory block is in a row within the second memory block immediately below the row within the second memory block that corresponds to the row of the first location within the first memory block, and in a column within the second memory block that corresponds to the column of the first location within the first memory block; and
the first location within the third memory block is in a row within the third memory block immediately below the row within the third memory block that corresponds to the row of the first location within the second memory block, and in a column within the third memory block that corresponds to the column of the first location within the second memory block.

7. The method of claim 5, wherein operation (a) comprises:
in the first memory block, writing a first sample of the subset to a second location;
in the second memory block, writing a second sample of the subset to a second location that is shifted within the second memory block relative to the second location within the first memory block, where the first sample of the subset immediately temporally precedes the second sample of the subset in the subset; and
in the third memory block, writing a third sample of the subset to a second location that is shifted within the third memory block relative to the second location within the first memory block and relative to the second location within the second memory block, where the second sample of the subset immediately temporally precedes the third sample of the subset in the subset.

8. The method of claim 1, wherein operation (b) is performed responsive to respective rows of the memory blocks being respectively filled with the samples of the subset being written to them.

9. The method of claim 8, wherein operation (b) is performed responsive to:
a row of a first memory block being filled;
a row of a second memory block immediately below the row of the second memory block that corresponds to the row of the first memory block being filled; and
a row of a third memory block immediately below the row of the third memory that corresponds to the row of the second memory block being filled.

10. The method of claim 1, wherein the at least one of the memory blocks comprises locations that have been initialized but to which a sample has not yet been written.

11. The method of claim 1, wherein operation (c) comprises, for at least one of the additional subsets of the samples, writing samples of that subset to the same locations of the memory blocks to which samples were written during operation (a).

12. The method of claim 1, wherein the at least one computer processor core comprises a central processing unit (CPU) or a graphical processing unit (GPU).

13. The method of claim 1, wherein each of the samples comprises a multiple-bit sequence.

14. A non-transitory computer-readable medium storing instructions for execution by at least one computer processor core in operable communication with memory, the instructions being for causing the at least one computer processor core to perform operations on a stream of time ordered samples of a signal, the operations comprising:
(a) writing a subset of the samples to memory blocks such that temporally adjacent samples are written to different memory blocks than one another, and at least some non-temporally adjacent samples are written to the same memory blocks as one another wherein the memory includes M memory blocks each of dimension MN, where M is an integer equal to the number of rows in each of the memory blocks, and N is an integer equal to the number of columns in each of the memory blocks;
(b) generating a vector by reading out the samples from at least one of the memory blocks, wherein operation (b) comprises transposing and vectorizing the at least one of the memory blocks; and
(c) repeating operations (a) and (b) for additional subsets of the samples and additional memory blocks to generate a sequence of vectors forming a stream of convolutionally interleaved samples of the signal.

15. The non-transitory computer-readable medium of claim 14, wherein the instructions cause a portion of operation (a) and a portion of operation (b) to be performed by a first processor core, and another portion of operation (a) and another portion of operation (b) to be performed by a second processor core.

16. The non-transitory computer-readable medium of claim 14, the instructions further comprising, and causing to be performed by a third processor core:
(d) receiving the vector of the samples generated in operation (b) by the first processor core and the vector of the samples generated in operation (b) from the second processor core;
(e) concatenating the vectors of operation (d) to generate a portion of the stream of convolutionally interleaved samples of the signal;
(f) outputting to the first processor core a portion of one of the additional subsets of the samples and outputting to the second processor core another portion of one of the additional subsets of the samples; and
(g) repeating operations (d) through (f), synchronously with operations (a) and (b), for the additional subsets of the samples.

17. The non-transitory computer-readable medium of claim 14, wherein the instructions cause a size of the subset of the samples to be selected to fit entirely within a cache of the at least one computer processor core.

18. The non-transitory computer-readable medium of claim 14, wherein operation (a) comprises:
in a first memory block, writing a first sample of the subset to a first location;
in a second memory block, writing a second sample of the subset to a first location that is shifted within the second memory block relative to the first location within the first memory block; and
in a third memory block, writing a third sample of the subset to a first location that is shifted within the third memory block relative to the first location within the first memory block and relative to the first location within the second memory block.

19. The non-transitory computer-readable medium of claim 18, wherein:
- the first location within the first memory block is in a row within the first memory block and a column within the first memory block;
- the first location within the second memory block is in a row within the second memory block immediately below the row within the second memory block that corresponds to the row of the first location within the first memory block, and in a column within the second memory block that corresponds to the column of the first location within the first memory block; and
- the first location within the third memory block is in a row within the third memory block immediately below the row within the third memory block that corresponds to the row of the first location within the second memory block, and in a column within the third memory block that corresponds to the column of the first location within the second memory block.

20. The non-transitory computer-readable medium of claim 18, wherein operation (a) comprises:
- in the first memory block, writing a first sample of the subset to a second location;
- in the second memory block, writing a second sample of the subset to a second location that is shifted within the second memory block relative to the second location within the first memory block, where the first sample of the subset immediately temporally precedes the second sample of the subset in the subset; and
- in the third memory block, writing a third sample of the subset to a second location that is shifted within the third memory block relative to the second location within the first memory block and relative to the second location within the second memory block, where the second sample of the subset immediately temporally precedes the third sample of the subset in the subset.

21. The non-transitory computer-readable medium of claim 14, wherein the instructions cause operation (b) to be performed responsive to respective rows of the memory blocks being respectively filled with the samples of the subset being written to them.

22. The non-transitory computer-readable medium of claim 21, wherein the instructions cause operation (b) to be performed responsive to:
- a row of a first memory block being filled;
- a row of a second memory block immediately below the row of the second memory block that corresponds to the row of the first memory block being filled; and
- a row of a third memory block immediately below the row of the third memory that corresponds to the row of the second memory block being filled.

23. The non-transitory computer-readable medium of claim 14, wherein one of the memory blocks comprises locations that have been initialized but to which a sample has not yet been written.

24. The non-transitory computer-readable medium of claim 14, wherein operation (c) comprises, for at least one of the additional subsets of the samples, writing samples of that subset to the same locations of the memory blocks to which samples were written during operation (a).

25. The non-transitory computer-readable medium of claim 14, wherein the at least one computer processor core comprises a central processing unit (CPU) or a graphical processing unit (GPU).

26. The non-transitory computer-readable medium of claim 14, wherein each of the samples comprises a multiple-bit sequence.

* * * * *